(12) United States Patent
Goto

(10) Patent No.: US 6,452,193 B1
(45) Date of Patent: *Sep. 17, 2002

(54) ELECTRON BEAM EXPOSURE APPARATUS, ELECTRON LENS, AND DEVICE MANUFACTURING METHOD

(75) Inventor: Susumu Goto, Tama (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/452,376

(22) Filed: Dec. 1, 1999

(30) Foreign Application Priority Data

Dec. 2, 1998 (JP) .......................... 10-342964

(51) Int. Cl.⁷ ..................... H01L 21/027; H01J 37/304
(52) U.S. Cl. ................................... 250/491.1
(58) Field of Search ................. 250/492.2, 491.2, 250/492 R, 492.23, 492.1, 491.1; 355/53

(56) References Cited

U.S. PATENT DOCUMENTS

| 4,198,569 A | * | 4/1980 | Takayama | ............... 250/492 R |
|---|---|---|---|---|
| 4,812,662 A | | 3/1989 | Goto et al. | ............... 250/491.1 |
| 4,939,371 A | | 7/1990 | Goto | ......................... 250/397 |
| 5,770,863 A | * | 6/1998 | Nakasuji | .................. 250/492.2 |
| 5,864,142 A | | 1/1999 | Muraki et al. | ........... 250/491.1 |
| 5,929,454 A | * | 7/1999 | Muraki et al. | ........... 250/491.1 |
| 5,973,333 A | * | 10/1999 | Nakasuji et al. | ........ 250/492.23 |
| 6,069,684 A | * | 5/2000 | Galladay et al. | .............. 355/53 |

FOREIGN PATENT DOCUMENTS

JP  10-135102  5/1998

\* cited by examiner

Primary Examiner—Jack Berman
Assistant Examiner—Johnnie L Smith
(74) Attorney, Agent, or Firm—Fitzpatrick, Cella, Harper & Scinto

(57) ABSTRACT

This invention provides an electron beam exposure apparatus and electron lens which realize high resolution and high throughput simultaneously. In an electron beam exposure apparatus for irradiating a mask having a transfer pattern with an electron beam and projecting and transferring the pattern onto a substrate using an electron projecting lens, the electron projecting lens has a magnetic doublet lens. Each of the front- and rear-side electromagnetic lens sections of the magnetic doublet lens is constructed of a non-rotational lens. In each electro magnetic lens section, the non-rotational lens is constructed of a pair of electromagnetic lenses having symmetrical shapes.

19 Claims, 7 Drawing Sheets

ELECTRON BEAM EXPOSURE APPARATUS, ELECTRON LENS, AND DEVICE MANUFACTURING METHOD

BACKGROUND OF THE INVENTION

1. Field of the Invention

The present invention relates to an electron beam exposure apparatus used for the exposure process of a semiconductor integrated circuit or the like, an electron projecting lens suitable for the electron beam exposure apparatus, and a device manufacturing method.

2. Description of the Related Art

In recent years, electron beam exposure apparatuses have been under development for the purpose of improving the accuracy and productivity of microdevices such as semiconductor devices. As one technique of electron beam exposure, a pattern to be transferred onto a sample is divided into a plurality of divisions, and the plurality of divisions is formed on a mask. The mask is irradiated with an electron beam, and simultaneously, the mask stage on which the mask is placed is continuously moved in one direction such that the sample is irradiated with the electron beam transmitted through the mask. According to this technique, since the electron beam irradiation area can be made wider than that of a conventional electron beam exposure technique using the partial full exposure method, improvements in both resolution and mass productivity can be expected.

Normally, an electron projecting lens having a magnetic doublet lens is used for the projecting system. A stop for separating scattered electrons at the pattern portion of the transfer mask from unscattered electrons at the mask membrane portion is disposed at a position obtained by dividing the distance between the mask and the sample by the magnification ratio of the electron projecting lens. However, the maximum exposure area of the apparatus of this type is about several hundred μm, and a lower throughput is obtained relative to the conventional optical exposure method. The factor that determines the exposure area is degradation in resolution due to off-axis aberrations of the electron projecting lens constructed by a magnetic doublet lens. The off-axis aberrations of the electron projecting lens mainly include curvature of field and astigmatism.

To remove the curvature of field of an electron projecting lens system, a technique has been proposed, which uses not an electron beam on the optical axis of the electron projecting lens system, but a charged particle beam shaped to have a sectional shape defined by two arcs about the optical axis, i.e., a charge particle beam having an arcuated section with which the influence of curvature of field of the electron projecting lens system becomes constant (Japanese Patent Laid-Open No. 10-135102).

FIG. 7 shows a conventional reduction transfer apparatus using an arcuated electron beam. An electron beam 2 emitted from an electron gun 1 forms an image on an aperture 4 for shaping the crossover image formed by the electron gun 1 into an arcuated beam. A transfer mask 8 placed on a mask stage 9 is uniformly irradiated with a beam 3 shaped into an arcuated shape through an electron reduction lens 6 and collimator lens 7 on the rear side. As the transfer mask 8, either a scattering type mask having a scattering pattern on the thin-film mask substrate that passes the electron beam for scattering the electron beam, or a stencil type mask having an absorbing pattern for shielding or attenuating the electron beam can be used. However, when the restriction or reduction ratio of the exposure pattern is taken into consideration, a scattering mask is more practical. In this case, a scattering transfer mask 8 is employed. A scattered electron limiting aperture 11 stops electron beams that have passed through the scattering pattern while allowing electron beams pass through portions without the scattering pattern, thereby irradiating a wafer 16 with an electron beam carrying pattern information.

The astigmatism which is the main aberration of electromagnetic lens sections 120 and 140 constructing the electron projecting lens is corrected by an astigmatism correction electrode 10. This correction electrode 10 has an arcuated slit. When a voltage is applied across the conductive thin film formed on the lower surface of the transfer mask 8 and the correction electrode 10, an electrostatic lens having a concave lens function with respect to the electron beam is formed in the radial direction.

The astigmatism correction electrode 10 has, in the radial direction of the electron projecting lens, a concave lens function with respect to the electron beam. For this reason, when the astigmatic axis of the astigmatism of the electron projecting lens (major axis of the elliptical blur of the electron beam due to the astigmatism and curvature of field) matches the direction of the concave lens function of the astigmatism correction electrode 10, the astigmatism can be corrected.

However, when the electron projecting lens is formed by a magnetic doublet (electron lens formed from two, front- and rear-side electromagnetic lens sections) used for an electron beam reduction transfer apparatus, the direction of the concave lens function of the electrostatic astigmatism corrector does not match the direction of the astigmatic axis of the astigmatism, as shown in FIG. 4. The reason for this is as follows. Since the electron beam is rotated in the magnetic doublet lens of a reduction system, anisotropic components of astigmatism (imaginary part of an astigmatic coefficient) are present, and the direction of the astigmatic axis of the electron projecting lens is different from the correction direction of the electrostatic astigmatism corrector. Hence, when an arcuated electron beam in which the optical axis of the electron projecting lens and the principal ray of the electron beam are offset is employed, it is difficult to correct the astigmatism of the electron projecting lens by the electrostatic astigmatism corrector.

SUMMARY OF THE INVENTION

The present invention has been made in consideration of the above problem of the prior art, and has as its object to provide an electron beam exposure apparatus having resolution and throughput higher than those of the prior art or an electron lens applicable to the apparatus and, more specifically, to reduce anisotropic components of the astigmatism of the electron lens of an electron beam exposure apparatus in which the optical axis of the electron projection lens system and the principal ray axis of the electron beam are offset, and to remove the astigmatism by a corrector such as an electrostatic astigmatism corrector.

According to a first aspect of the present invention, there is provided an electron beam exposure apparatus for drawing a pattern on a substrate while irradiating the substrate with an electron beam through an electron projecting lens, wherein the electron projecting lens has a magnetic doublet lens including a pair of electromagnetic lens sections, each constructed by a non-rotational lens.

In the electron beam exposure apparatus according to the first aspect of the present invention, the non-rotational lens serving as the electromagnetic lens section preferably comprises a pair of symmetrical electromagnetic lenses.

In the electron beam exposure apparatus according to the first aspect of the present invention, on-axis field distributions generated by the pair of electromagnetic lenses preferably have opposite polarities.

In the electron beam exposure apparatus according to the first aspect of the present invention, exciting currents supplied to the pair of electromagnetic lenses, preferably have substantially the same magnitude, but opposite directions.

In the electron beam exposure apparatus according to the first aspect of the present invention, preferably, exciting coils of the pair of electromagnetic lenses are wound in opposite directions, and the exciting coils of the electromagnetic lenses are series-connected.

In the electron beam exposure apparatus according to the first aspect of the present invention, exposure is preferably executed using an electron beam passing through an off-axis portion of the electron projecting lens.

In the electron beam exposure apparatus according to the first aspect of the present invention, exposure is preferably executed using an electron beam passing through an arcuated off-axis portion of the electron projecting lens.

The electron beam exposure apparatus according to the first aspect of the present invention preferably further comprises a corrector for correcting aberration of the electron projecting lens.

The electron beam exposure apparatus according to the first aspect of the present invention preferably further comprises an astigmatism corrector for correcting astigmatism of the electron projecting lens.

In the electron beam exposure apparatus according to the first aspect of the present invention, the astigmatism corrector preferably has a concave lens function in the radial direction of the electron projecting lens.

According to a second aspect of the present invention, there is provided a device manufacturing method comprising the steps of applying a resist to a substrate, drawing a pattern on the substrate to which the resist is applied, using an electron beam exposure apparatus, and developing the substrate on which the pattern is drawn, wherein the electron beam exposure apparatus draws the pattern on the substrate while irradiating the substrate with an electron beam through an electron projecting lens, the electron projecting lens having a magnetic doublet lens including a pair of electromagnetic lens sections, each constructed by a non-rotational lens.

According to a third aspect of the present invention, there is provided an electron lens comprising a magnetic doublet lens having two electromagnetic lens sections, each constructed by a non-rotational lens.

In the electron lens according to the third aspect of the present invention, the non-rotational lens serving as the electromagnetic lens section preferably comprises a pair of symmetrical electromagnetic lenses.

In the electron lens according to the third aspect of the present invention, on-axis field distributions generated by the pair of electromagnetic lenses preferably have opposite polarities.

In the electron lens according to the third aspect of the present invention, exciting currents supplied to the pair of electromagnetic lenses preferably have substantially the same magnitude, but opposite directions.

In the electron lens according to the third aspect of the present invention, preferably, exciting coils of the pair of electromagnetic lenses are wound in opposite directions, and the exciting coils of the electromagnetic lenses are series-connected.

Further objects, features, and advantages of the present invention will become apparent from the following detailed description of the embodiments of the present invention with reference to the accompanying drawings.

DETAILED DESCRIPTION OF THE PREFERRED EMBODIMENT

Figure 3:
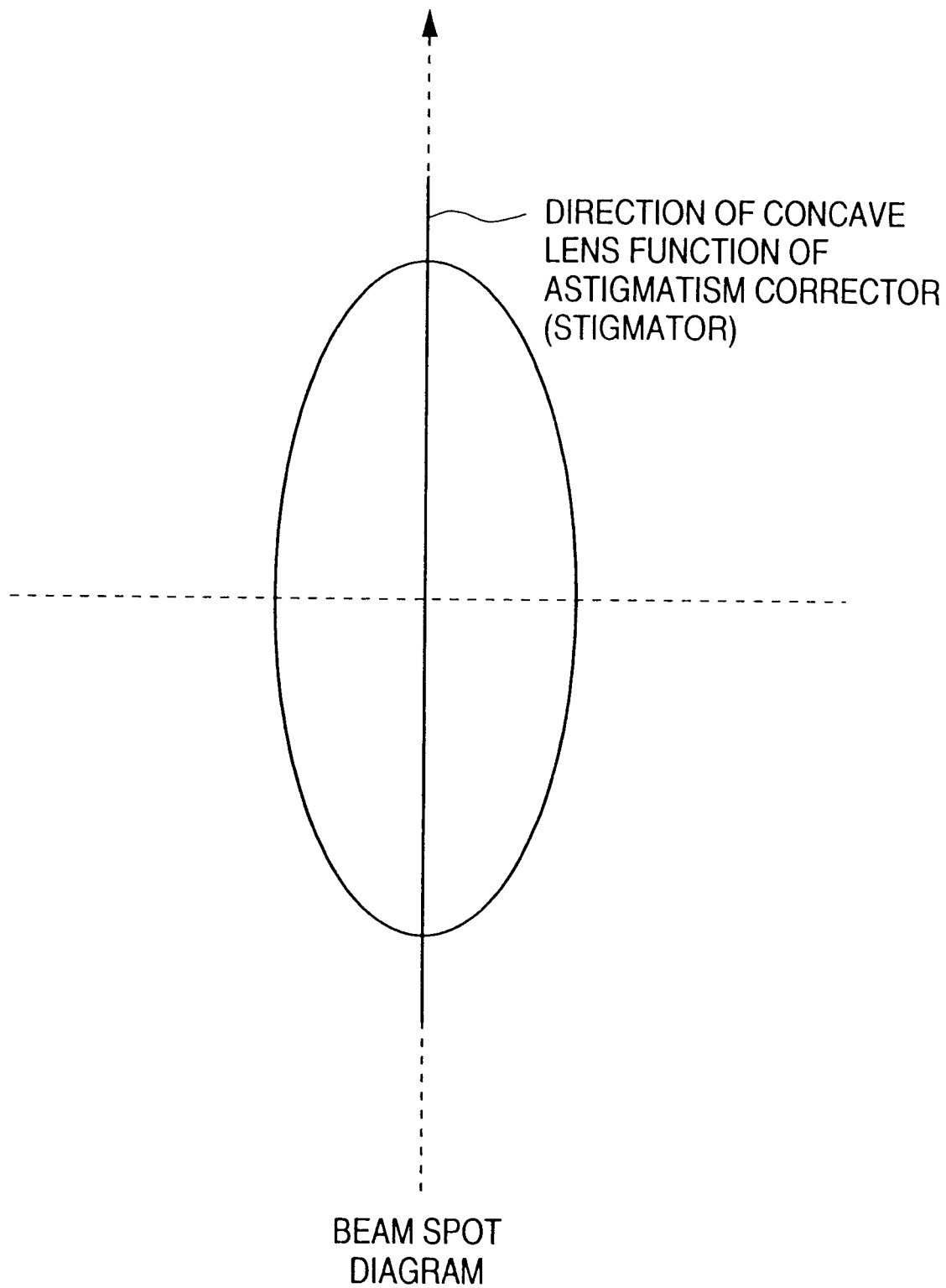
FIG. 3 is a view showing a beam spot diagram by astigmatism and curvature of field in the present invention.
Figure 4:
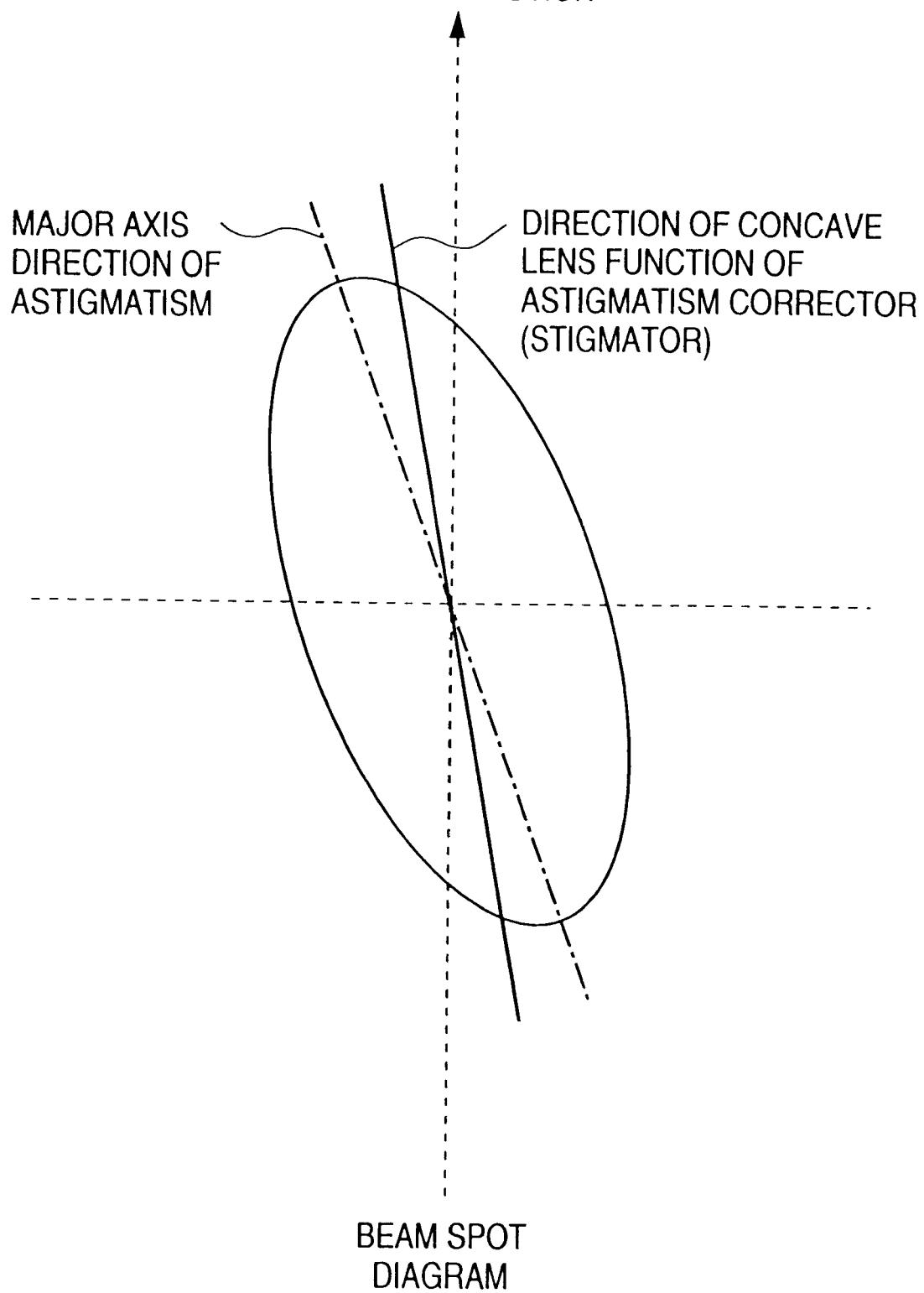
FIG. 4 is a view showing a beam spot diagram by astigmatism and curvature of field in a prior art apparatus.

An embodiment of the present invention will be described below with reference to the accompanying drawings. The electron lens used for this electron beam transfer exposure apparatus includes a magnetic doublet lens formed by two electromagnetic lens sections. Each electromagnetic lens section includes two symmetrical electromagnetic lenses having symmetrical magnetic pole pieces, yokes, and exciting coils. For example, when the exciting coils of the two symmetrical electromagnetic lenses are wound in the same direction, and currents are supplied to the two exciting coils in opposite directions, the electromagnetic lens section operates as a non-rotational lens. Anisotropic components of astigmatism in the magnetic doublet lens (electron lens) formed from two non-rotational lenses (electromagnetic lens sections) are eliminated, so the astigmatism has only isotropic components. As shown in FIG. 3, since the major axis direction of the astigmatism can be matched with the direction of the concave lens function of an electrostatic astigmatism corrector, the astigmatism is corrected.

Figure 1:
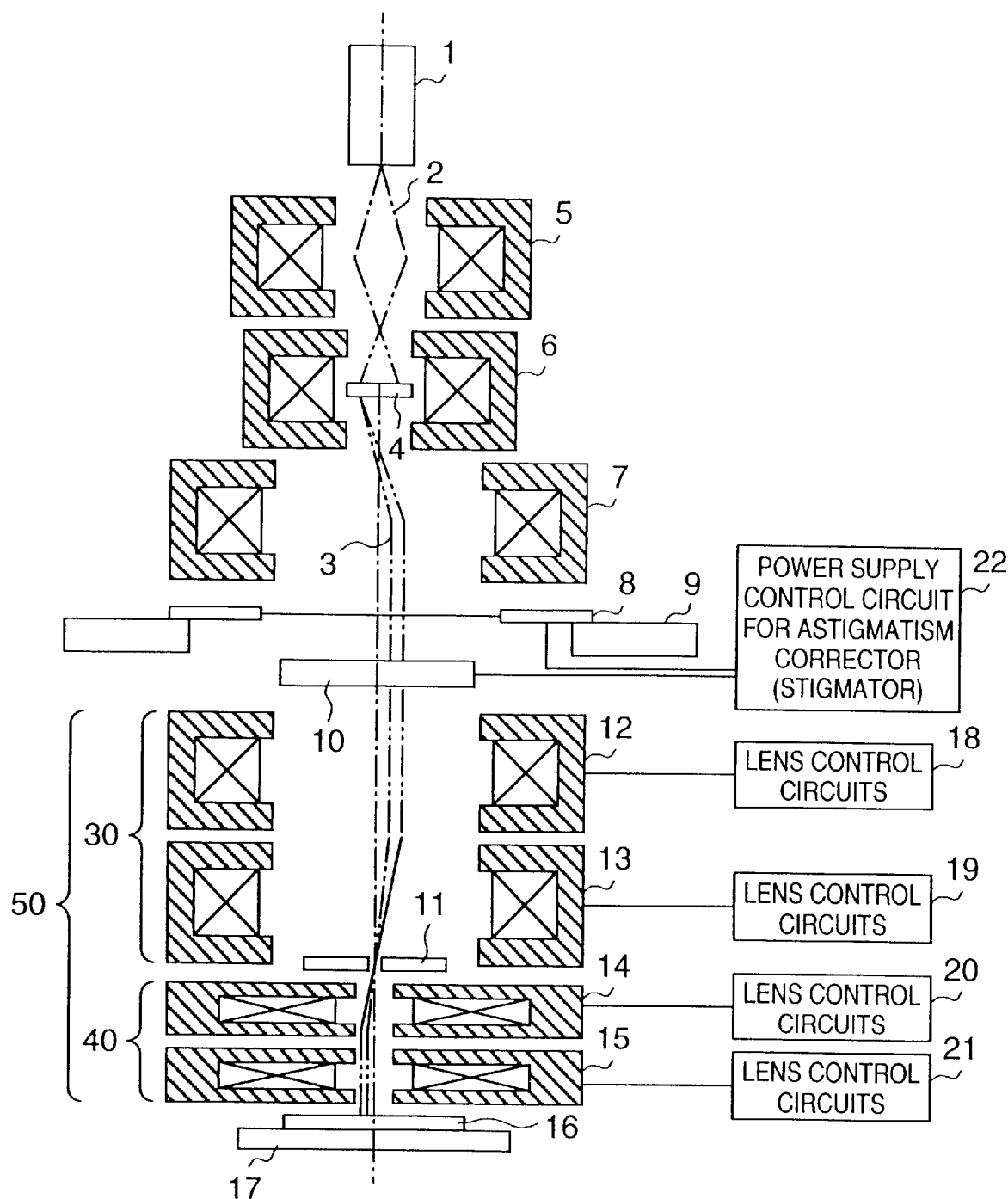
FIG. 1 is a view showing an electron beam transfer exposure apparatus using an electron projecting lens according to a preferred embodiment of the present invention.
Figure 2:
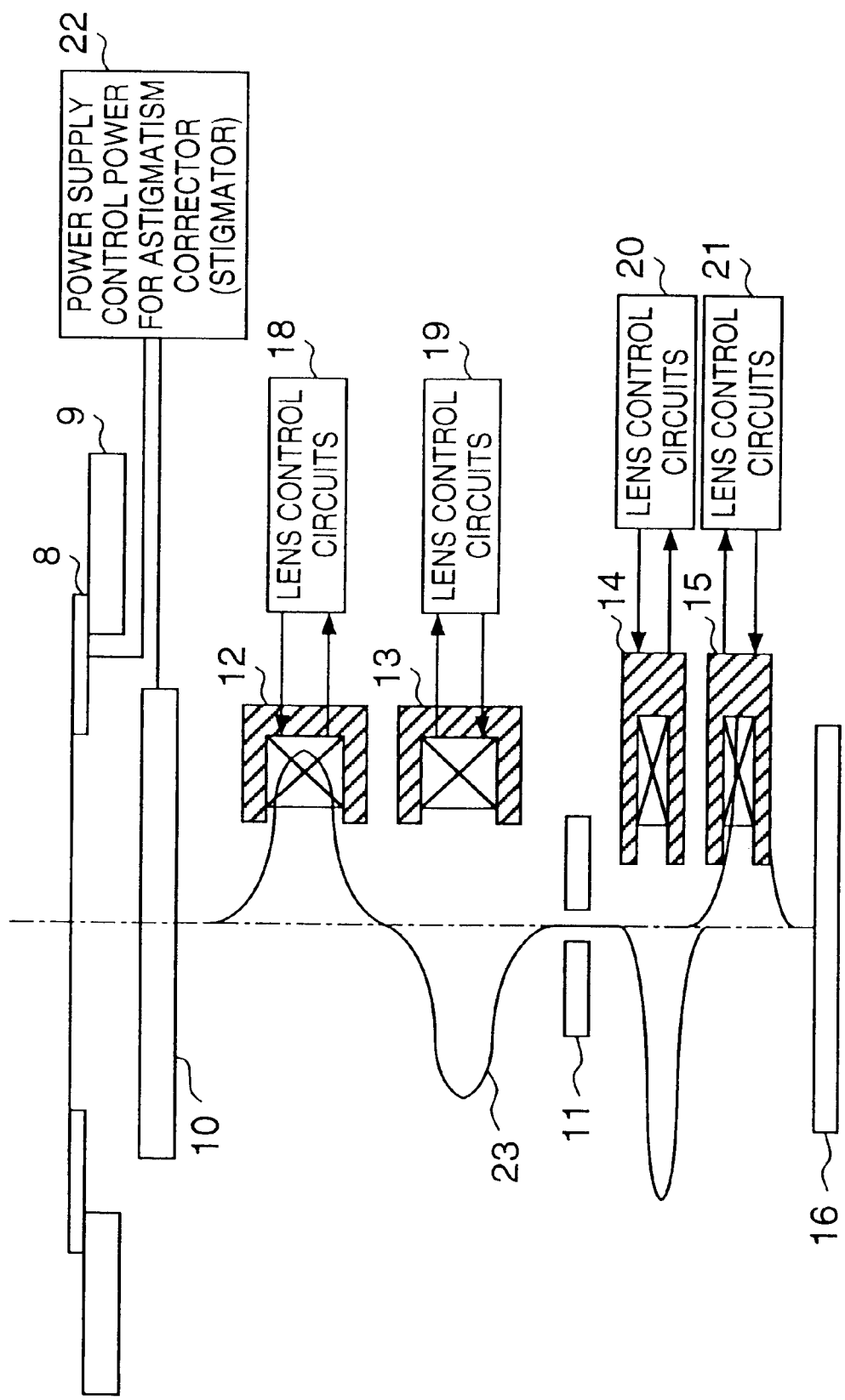
FIG. 2 is a partial enlarged view of the apparatus shown in FIG. 1.

A more specific embodiment will be described below with reference to the accompanying drawings. FIG. 1 shows the arrangement of an electron beam exposure apparatus using an arcuated electron beam. FIG. 2 shows the arrangement of an electron projecting lens and the on-axis field distribution of the electron projecting lens.

Referring to FIG. 1, an electron gun 1 emits an electron beam 2. The electron beam 2 is shaped into an arcuated beam 3 having a desired radius and width by electron reduction lenses 5 and 6 and aperture 4. A transfer mask 8 placed on a mask stage 9 is uniformly irradiated with the electron beam through a collimator lens 7. The transfer mask 8 has a structure in which a scattering pattern for scattering an electron beam is formed on a thin-film mask substrate that allows an electron beam to pass therethrough. Scattered electron limiting aperture 11 stops electron beams that have passed through the scattering pattern while it allows electron beam components to pass through portions without the scattering pattern, thereby irradiating a wafer 16 with an electron beam carrying pattern information. The transfer pattern is formed on the wafer 16 by exposure by scanning the mask stage 9 and a wafer stage (X-Y stage) 17. An array of a plurality of patterns is transferred onto the wafer by the step-and-scan operation that combines a scanning operation of scanning and exposing in the X direction and a step operation of moving the mask and wafer stepwise in the Y direction.

The pattern of the transfer mask is projected onto the wafer 16 at a desired magnification through an electron projecting lens 50. The electron projecting lens 50 is a magnetic doublet lens having a front-side lens (on the object surface side of the pupil surface) formed from a pair of electromagnetic lenses 12 and 13 having symmetrical shapes and arranged symmetrically, and a rear-side lens (on the image plane side of the pupil surface) formed from a pair of electromagnetic lenses 14 and 15 having symmetrical shapes and arranged symmetrically. Currents are supplied from lens current driving control circuits 18, 19, 20, and 21 to the exciting coils of the electromagnetic lenses 12 to 15 of the electron projecting lens 50, respectively. The exciting currents supplied to the exciting coils of the electromagnetic lenses 12 and 13 which are symmetrical with each other have opposite polarities. The exciting currents supplied to the exciting coils of the electromagnetic lenses 14 and 15 which are symmetrical with each other have opposite polarities.

Astigmatism generated in the electron projecting lens 50 is corrected by an astigmatism corrector 10. This astigmatism corrector 10 includes an electrode having an arcuated slit conforming to the shape of the electron beam. The astigmatism corrector 10 produces a concave lens function for the electron beam that has passed through the transfer mask in accordance with a voltage applied from an astigmatism corrector control power supply circuit 22 across the electrode and the conductive thin film formed on the lower surface of the transfer mask 8, thereby correcting the astigmatism.

As described above, the electron projecting lens 50 shown in FIG. 2 has two front-side electromagnetic lenses and two rear-side electromagnetic lenses, i.e., a total of four electromagnetic lenses 12 to 15. For the electromagnetic lenses 12 and 13, the gap lengths and bore diameters of the magnet lens pole pieces, shapes of the lens yokes, and shapes and winding directions of the exciting coils are the same. The electromagnetic lenses 14 and 15 also have shapes symmetrical with each other.

In exposure, exciting currents are supplied from the lens current control circuits 18 and 19 to the exciting coils of the pair of symmetrical electromagnetic lenses 12 and 13 such that the synthesized focal length of the electromagnetic lenses 12 and 13 becomes ½ the distance between the mask 8 and the scattered electron limiting aperture 11. The currents flow in opposite directions. An on-axis field distribution 23 of the electron projecting lens at that time has two portions having the same shape but opposite polarities. An electromagnetic lens section 30 constructed by the two electromagnetic lenses 12 and 13 with these conditions operates as a non-rotational lens whose magnification is one. The pair of electromagnetic lenses 14 and 15 are also symmetrical with each other, and an electromagnetic lens section 40 constructed by these lenses also operates as a non-rotational lens. Since the electron projecting lens 50 operates as a non-rotational lens as a whole, the imaginary part of the off-axis aberration coefficient of the electron projecting lens 50 becomes zero, and anisotropic components of the off-axis aberration of the lens are eliminated. As shown in FIG. 3, in the spot diagram representing the shape of blur of the electron beam due to the astigmatism and curvature of field, the major axis direction of the electron beam matches the radial direction, and the direction of the concave lens function of the astigmatism corrector also matches the radial direction. For this reason, the astigmatism can be corrected.

When the exciting coils of the symmetrical electromagnetic lenses 12 and 13 (and also 14 and 15) are wound in opposite directions and series-connected, the number of lens control circuits can be decreased. Hence, the arrangement can be simplified, and high reliability can be obtained.

As described above, the magnetic doublet type electron projecting lens 50 whose electromagnetic lens sections 30 and 40 are constructed by non-rotational lenses can cancel rotational chromatic aberration due to current ripple in the lens control circuits 18 to 21.

This magnetic doublet type electron projecting lens is suitably used for, e.g., an electron beam exposure apparatus for transferring a mask pattern to a substrate using off-axis components of an electron optical system. When this magnetic doublet type electron projecting lens is applied to such an electron beam exposure apparatus, the direction of astigmatism correction by the electrostatic astigmatism corrector can be matched with the major axis direction of astigmatism of the electron projecting lens, and the astigmatism can be corrected. As a consequence, an arcuated electron beam with a large electron beam irradiation area can be used while correcting the astigmatism of the electron projecting lens. Hence, both the throughput and resolution of the transfer pattern can be improved.

Figure 5:
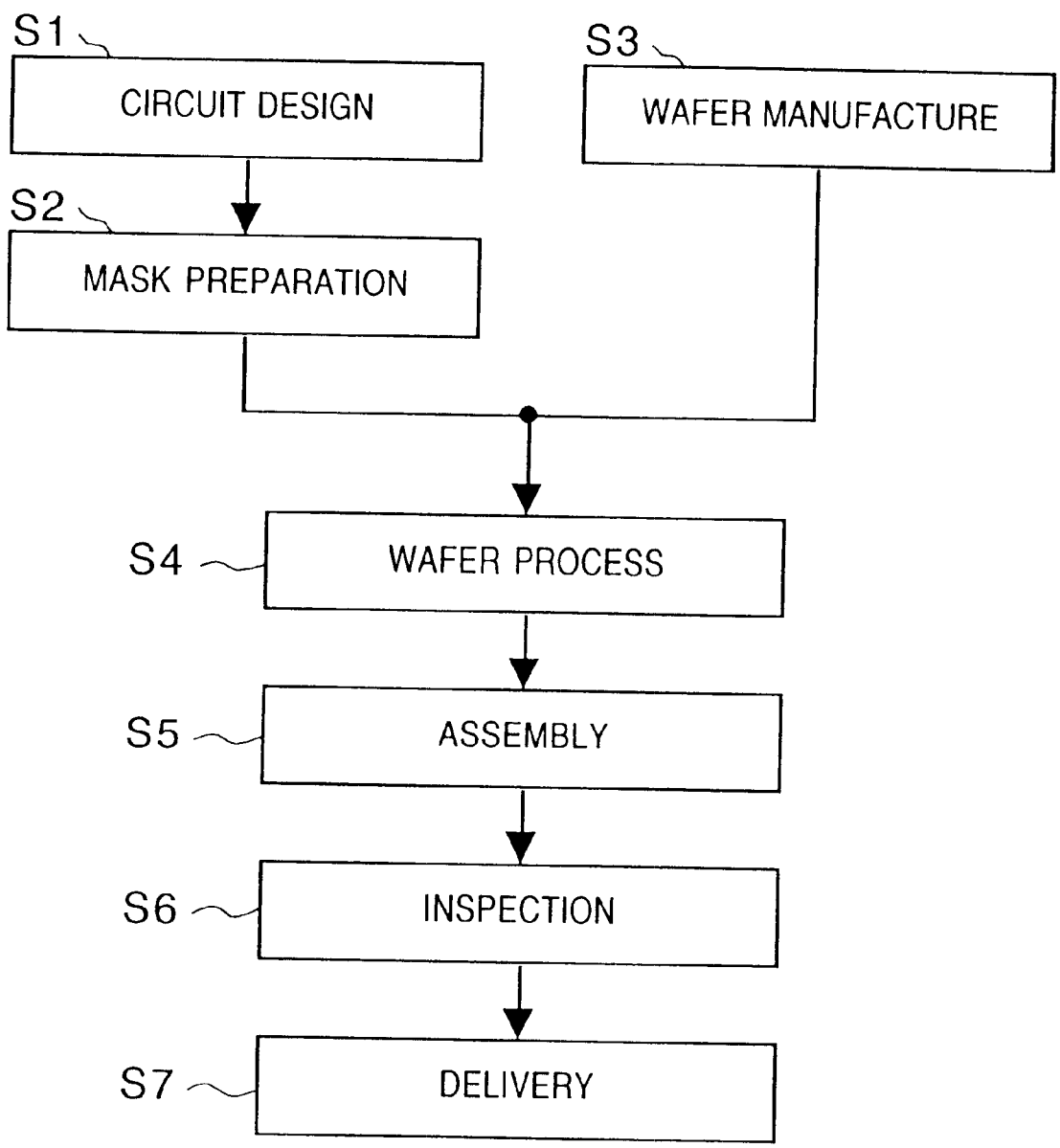
FIG. 5 is a flow chart showing the flow of device manufacture.

An embodiment of a device manufacturing method using the above-described electron beam exposure apparatus will be described next. FIG. 5 shows a flow diagram for manufacturing a microdevice (e.g., a semiconductor chip such as an IC or an LSI, a liquid crystal panel, a CCD, a thin-film magnetic head, or a micromachine). In step 1 (circuit design), the pattern of a device is designed. In step 2 (mask preparation), a mask having the designed pattern is prepared. In step 3 (wafer manufacture), a wafer is manufactured using a material such as silicon or glass. In step 4 (wafer process), called a preprocess, an actual circuit is formed on the wafer by lithography using the prepared mask and wafer. In step 5 (assembly), called a post-process, a semiconductor chip is formed from the wafer prepared in step 4. This step includes processes such as assembly (dicing and bonding) and packaging (chip encapsulation). In step 6 (inspection), inspections including operation check testing and durability testing of the semiconductor device manufactured in step 5 are performed.

A semiconductor device is completed with these processes and delivered (step 7).

Figure 6:
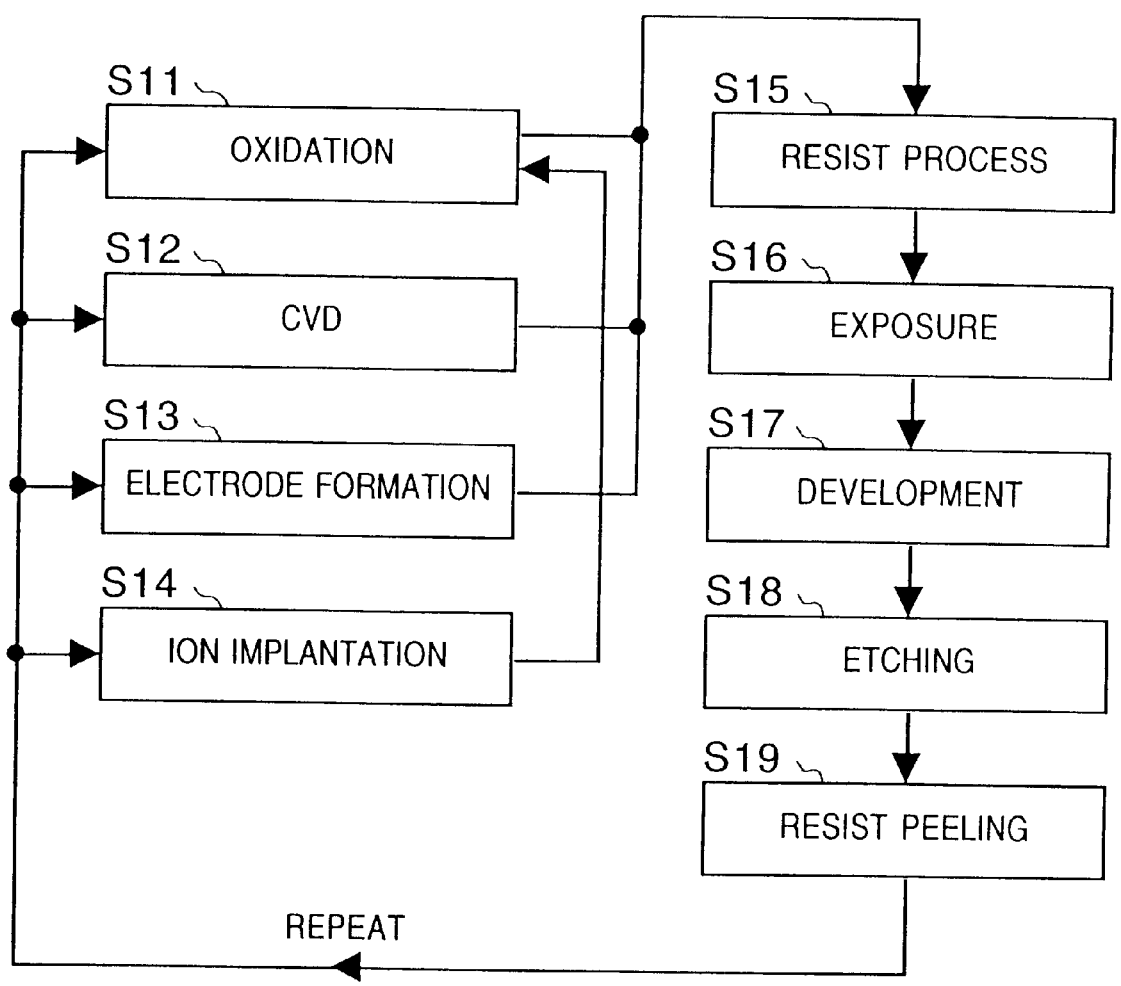
FIG. 6 is a flow chart showing the detailed flow of the wafer process.
Figure 7:
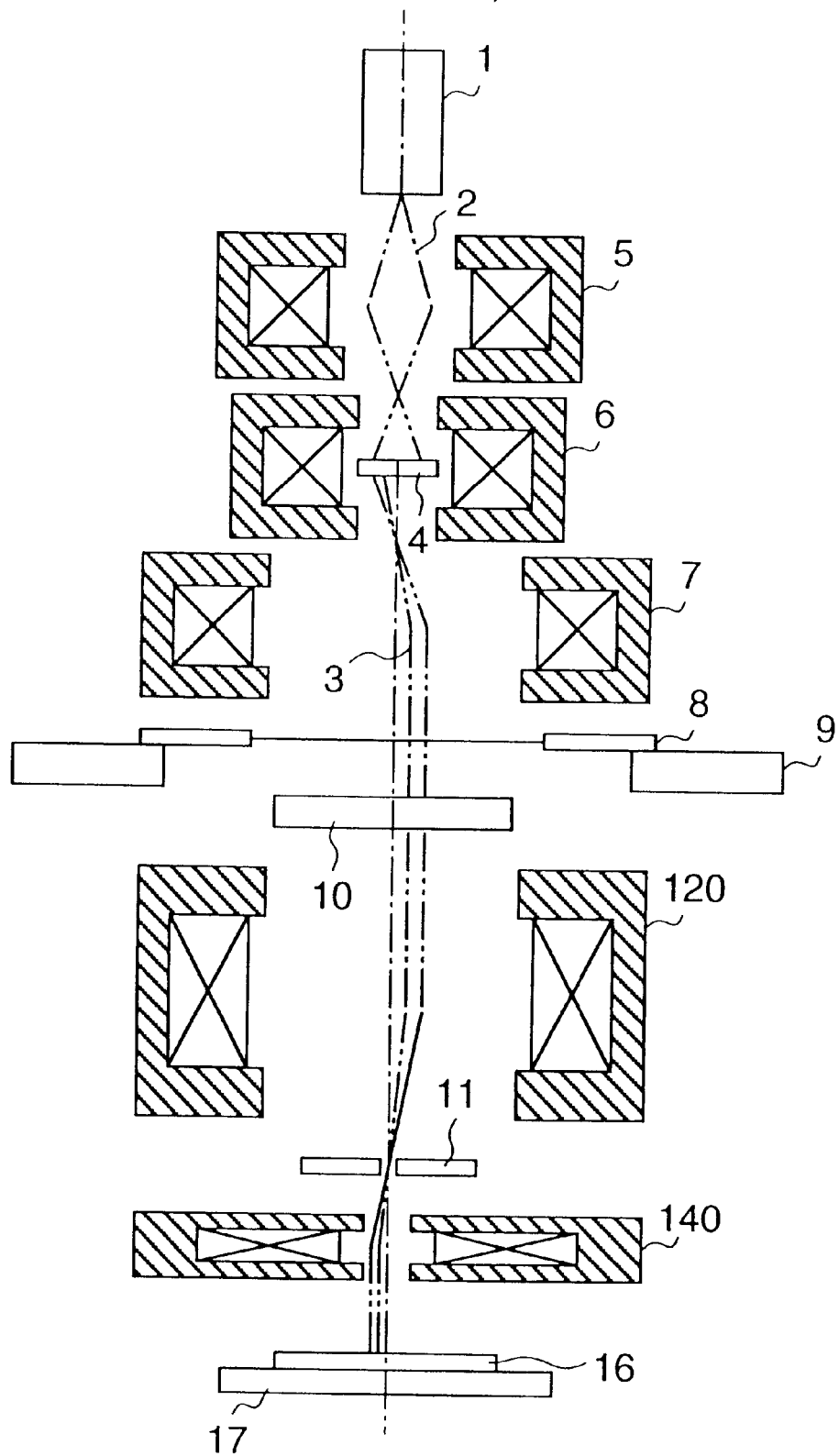
FIG. 7 is view showing a conventional electron beam transfer exposure apparatus.

FIG. 6 shows details of the wafer process. In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted into wafer. In step 15 (resist process), a resist is applied to the wafer. In step 16 (exposure), the circuit pattern of the mask is printed in a plurality of shot regions of the wafer by exposure using the above-described electron beam exposure apparatus. In step 17 (development), the exposed wafer is developed. In step 18 (etching), portions other than the developed resist image are etched. In step 19 (resist peeling), any unnecessary resist remaining after etching is removed. By repeating these steps, a multilayered structure of circuit patterns is formed on the wafer. When the production method of this embodiment is used, a precision device which is conventionally difficult to manufacture can be manufactured at low cost.

As has been described above, according to a preferred embodiment of the present invention, the electromagnetic lenses 30 and 40 of the magnetic doublet lens 50 serving as an electron projecting lens are formed from non-rotational lenses. For this reason, the astigmatism correction direction by the electrostatic astigmatism corrector can be matched with the major axis direction of the astigmatism of the electron projecting lens, and the astigmatism can be corrected. As a consequence, an arcuated electron beam with a large electron beam irradiation area can be used to improve both the throughput and resolution of the transfer pattern. Hence, an electron beam exposure apparatus or electron lens having resolution and throughput higher than those of the prior art can be provided.

The present invention is not limited to the above embodiments and various changes and modifications can be made within the spirit and scope of the present invention. Therefore, to apprise the public of the scope of the present invention, the following claims are made.

What is claimed is:

1. A device manufacturing method comprising the steps of:

providing an exposure apparatus including a projection system having at least one pair of electromagnetic lenses for irradiating a substrate with an electron beam;

generating magnetic field distributions for each lens of the at least one pair of lenses, wherein the field distribution generated by one lens of the at least one pair of lenses is congruent with a magnetic field distribution generated by the other lens of that pair, but has an opposite polarity;

exposing a substrate with an electron beam of the exposure apparatus to produce a device pattern; and processing the exposed substrate in accordance with a predetermined process to manufacture a device.

2. A projection system comprising:

at least one pair of electromagnetic lenses for irradiating a substrate with an electron beam, wherein one lens of the at least one pair of lenses generates a magnetic field distribution that is congruent with a magnetic field distribution generated by the other lens of that pair, but has an opposite polarity.

3. The projection system according to claim 2, wherein exciting currents supplied to said at least one pair of electromagnetic lenses have substantially the same magnitude, but opposite polarities.

4. The projection system according to claim 2, wherein exciting coils of said at least one pair of electromagnetic lenses are wound in opposite directions and are series-connected.

5. An exposure apparatus comprising:

a projection system including a magnetic doublet lens made up of two lens sections, each lens section having a pair of electromagnetic lenses for irradiating a substrate with an electron beam, wherein one lens of at least one of the two pairs of electromagnetic lenses generates a magnetic field distribution that is congruent with a magnetic field distribution generated by the other lens in that pair of electromagnetic lenses, but has an opposite polarity.

6. An exposure apparatus comprising:

a projection system having at least one pair of electromagnetic lenses for irradiating a substrate with an electron beam, wherein one lens of the at least one pair of lenses generates a magnetic field distribution that is congruent with a magnetic field distribution generated by the other lens of that pair, but has an opposite polarity, wherein said projection system is arranged so that an astigmatic axis of an astigmatism of said projection system matches a radial direction of said projection system; and an astigmatism corrector for correcting the astigmatism of said electron projection lens.

7. A device manufacturing method comprising the steps of:

providing an exposure apparatus including a projection system having at least one pair of electromagnetic lenses for irradiating a substrate with an electron beam, wherein the projection system is arranged so that an astigmatic axis of an astigmatism of the projection system matches a radial direction of said projection system;

providing an astigmatism corrector for correcting astigmatism of the projection system;

generating magnetic field distributions for each lens of the at least one pair of lenses, wherein the magnetic field distribution generated by one lens of the at least one pair of lenses is congruent with a magnetic field distribution generated by the other lens of that pair, but has an opposite polarity;

exposing a substrate with the electron beam of the exposure apparatus to produce a device pattern; and processing the exposed substrate in accordance with a predetermined process to manufacture a device.

8. An exposure apparatus comprising:

a projection system including a magnetic doublet lens made up of two lens sections, wherein each lens section has a pair of electromagnetic lenses for irradiating a substrate with an electron beam, and wherein one lens of each of the two pairs of electromagnetic lenses generates a magnetic field distribution that is congruent with a magnetic field distribution generated by the other respective lens of that pair of electromagnetic lenses, but has an opposite polarity.

9. A device manufacturing method comprising the steps of:

providing a projection system comprising a magnetic doublet lens made up of two lens sections, wherein each of the lens sections making up the magnetic doublet lens has a pair of electromagnetic lenses for irradiating a substrate with an electron beam, and wherein one lens of at least one of the two pairs of electromagnetic lenses generates a magnetic field distribution that is congruent with a magnetic field distribution generated by the other lens in that pair of electromagnetic lenses, but has an opposite polarity;

exposing a substrate with the electron beam of the exposure apparatus to produce a device pattern; and processing the exposed substrate in accordance with a predetermined process to manufacture a device.

10. An exposure apparatus comprising:

a projection system having at least one pair of electromagnetic lenses for irradiating a substrate with an electron beam, wherein one lens of the at least one pair of lenses generates a magnetic field distribution that is congruent with a magnetic field distribution generated by the other lens of that pair, but has an opposite polarity.

11. The apparatus according to claim 10, wherein exciting currents supplied to the at least one pair of electromagnetic lenses have substantially the same magnitude, but opposite directions.

12. The apparatus according to claim 10, wherein exciting coils of the at least one pair of electromagnetic lenses are wound in opposite directions, and the exciting coils of the electromagnetic lenses are series-connected.

13. The apparatus according to claim 10, wherein exposure is executed using an electron beam passing through an off-axis portion of said projection system.

14. The apparatus according to claim 10, wherein exposure is executed using an electron beam passing through an arcuate, off-axis portion of said projection system.

15. The apparatus according to claim 10, further comprising a corrector for correcting aberration of said projection system.

16. The apparatus according to claim 10, further comprising an astigmatism corrector for correcting astigmatism of said projection system.

17. The apparatus according to claim 16, wherein said astigmatism corrector has a concave lens function in a radial direction of said projection system.

18. The apparatus according to claim 14, further comprising an astigmatism corrector for correcting astigmatism of said projection system.

19. The apparatus according to claim 18, wherein said astigmatism corrector has a concave lens function in a radial direction of said projection system.

* * * * *

UNITED STATES PATENT AND TRADEMARK OFFICE
CERTIFICATE OF CORRECTION

PATENT NO. : 6,452,193 B1
DATED : September 17, 2002
INVENTOR(S) : Susumu Goto

It is certified that error appears in the above-identified patent and that said Letters Patent is hereby corrected as shown below:

Column 2,
Line 4, "pass" should read -- to pass --.

Column 4,
Line 10, "a partial enlarged" should read -- an enlarged partial --.

Column 6,
Line 38, "preprocess" should read -- pre-process --.

Signed and Sealed this

Eighteenth Day of February, 2003

JAMES E. ROGAN
*Director of the United States Patent and Trademark Office*